United States Patent

Pabich

[15] 3,707,108

[45] Dec. 26, 1972

[54] NAIL-LESS WING HEADED FASTENER

[72] Inventor: Richard W. Pabich, 4904 W. Fullerton Avenue, Chicago, Ill. 60639

[22] Filed: May 18, 1970

[21] Appl. No.: 38,375

[52] U.S. Cl. ....................85/5 P, 29/628, 248/361 W, 24/73 RM, 85/5 R

[51] Int. Cl. ..........................F16b 19/00, H01r 43/00

[58] Field of Search.....85/5 P; 24/73 RM, 221 L, 221 R; 248/361 R, 361 W; 29/628

[56] References Cited

UNITED STATES PATENTS

| | | | |
|---|---|---|---|
| 1,256,311 | 2/1918 | Hartwig | 85/5 P |
| 1,382,112 | 6/1921 | Mitchell | 85/5 P |
| 1,486,451 | 3/1924 | Potter | 85/5 P |
| 2,024,805 | 12/1935 | Place | 85/5 P |
| 3,123,389 | 3/1964 | Biesecker | 24/221 L |
| 3,568,263 | 3/1971 | Meehan | 85/5 P |
| 3,588,968 | 6/1971 | Heilman | 85/5 P |

*Primary Examiner*—Thomas H. Eager
*Assistant Examiner*—D. P. Rooney
*Attorney*—Alter, Weiss & Whitesel

[57] ABSTRACT

Wing headed fasteners that require no nails to anchor them to a base. The fasteners are equipped to selectively retain a first article attached to a base. Tool attachments are provided which make it feasible to use automatic tools, such as air tools to removably anchor the fastener to bases.

7 Claims, 9 Drawing Figures

INVENTOR
RICHARD W. PABICH

BY
Alter, Weiss and Whitesel
ATTORNEYS

INVENTOR
RICHARD W. PABICH

BY
Alter, Weiss and Whitesel
ATTORNEYS

NAIL-LESS WING HEADED FASTENER

This invention is concerned with wing headed fasteners and more particularly with nail-less wing headed fasteners, the tool attachments and methods for automatically applying the nail-less wing headed fasteners to bases or first members for selectively attaching second members thereto.

In the not too distant past, most electronic and electrical assemblies were fabricated by connecting components such as resistors to terminals located on metal chassis and then interconnecting the components by wiring between the terminals on the metal chassis. Now most such assemblies utilize printed circuit boards or at least printed wiring boards. These printed circuit boards are then mechanically fastened to the chassis and multi-terminal connectors are used to interconnect the boards. In many cases, the connectors are attached directly to the chassis and the printed circuit boards are plugged into the connectors. Clamps or fasteners are required to retain the male and female connectors together to be sure that contact is maintained therein.

In the past, the clamps or other means of mechanically fastening the printed circuit board to the chassis have caused difficulties. For example, stresses have been placed on the printed circuit boards by the fastening means eventually causing breaks in the printed circuit board. In addition, the fasteners used in the past have been complicated clamping arrangements unnecessarily adding to the cost of the assembly of which the printed circuit board is a component.

Accordingly, an object of the invention is to provide a new method of removably fastening a first member to a second member.

A more detailed object of this invention is to provide a new fastener for removably attaching printed circuit boards to chassis.

Another object of this invention is to provide unique nail-less wing headed fasteners which can be used in attaching one planar object to another.

Yet another object of this invention is to provide tool attachments for use in automatically applying the nail-less wing headed fasteners to non-wooden surfaces.

Yet another object of this invention is to teach the methods for automatically applying unique nail-less wing headed fasteners.

Yet another object of this invention is to provide a serially attached chain of the unique nail-less wing headed fasteners which can be used in a staple gun type arrangement for automatically attaching these wing headed fasteners to chassis and the like.

A preferred embodiment of the unique nail-less wing headed fasteners comprises a main body section having at least one wing extending laterally or normally from the axis of the main body section. An appendage which may be integral to the main body section is provided. The appendage is larger in diameter than the main body section substantially centrally located between the top and bottom of the main body section. A first space is provided between the girdling appendage and the extended wing means of the wing headed fastener. The space is sufficiently large to accommodate the thickness of a printed circuit board or the like. The main body section terminates at its bottom most portion in a hemispherical arrangement. The hemispherical arrangement has a radius slightly larger than the radius of the cylindrical portion of the main body section. A second space is provided between the hemispherical arrangement and the girdling appendage. The second space is designed to receive the thickness of a chassis. The nail-less wing headed fasteners may be joined in a serial chain with the individual fasteners attached together by gate means.

This invention includes novel attachments for use with automatic nailing tools to automatically attach the nail-less wing headed fasteners to electrical chassis, or the like, for use in removably attaching printed circuit boards to the chassis. The attachments for the automatic nailing tools include magazines for holding the nail-less wing headed fasteners and means for aligning the nail-less wing headed fasteners with apertures in the chassis so that the piston means in the automatic nailer can be used to force the knob-like hemispherical end of the fastener into apertures in the chassis. The apertures in the chassis have radii which are slightly smaller than the radii of the knob-like hemispherical ends of the fasteners. The resiliency of the fastener enables the slightly larger knob-like hemispherical end to enter into the aperture and grasp the chassis in the space between the appendage and the knob-like hemisphere. The printed circuit board is held in the space between the appendage and the wings of the fastener. Thus, by turning the fastener a quarter turn, the printed circuit board is trapped by the fastener.

A preferred embodiment of the invention utilizes four such wing headed fasteners at opposite ends with at least two at each of the opposite ends of the printed circuit boards.

The above mentioned and other objects and features of this invention will become more readily apparent by reading the following description in conjunction with the accompanying drawings, wherein:

FIG. 3 is a side view of the inventive nail-less wing headed fastener;

FIG. 4 is a plan view of a chain comprising a series of interconnected nail-less wing headed fasteners;

FIG. 5 is a side view of an automatic nailing tool including an applique attachment used for automatically attaching the inventive wing headed fasteners to chassis or the like;

FIG. 6 is a bottom view of the tool showing the principle parts of the attachment of FIG. 5;

FIG. 7 is a sectional view of the magazine portion of the attachment looking in the direction of the arrow 7—7 in FIG. 6;

FIG. 8 shows a piston arrangement of the automatic nailing tool used in conjunction with the nail-less wing headed fasteners; and FIG. 9 is a partial perspective view showing how the individual nail-less fasteners are separated from the chain and driven into a chassis or the like.

Figure 1:
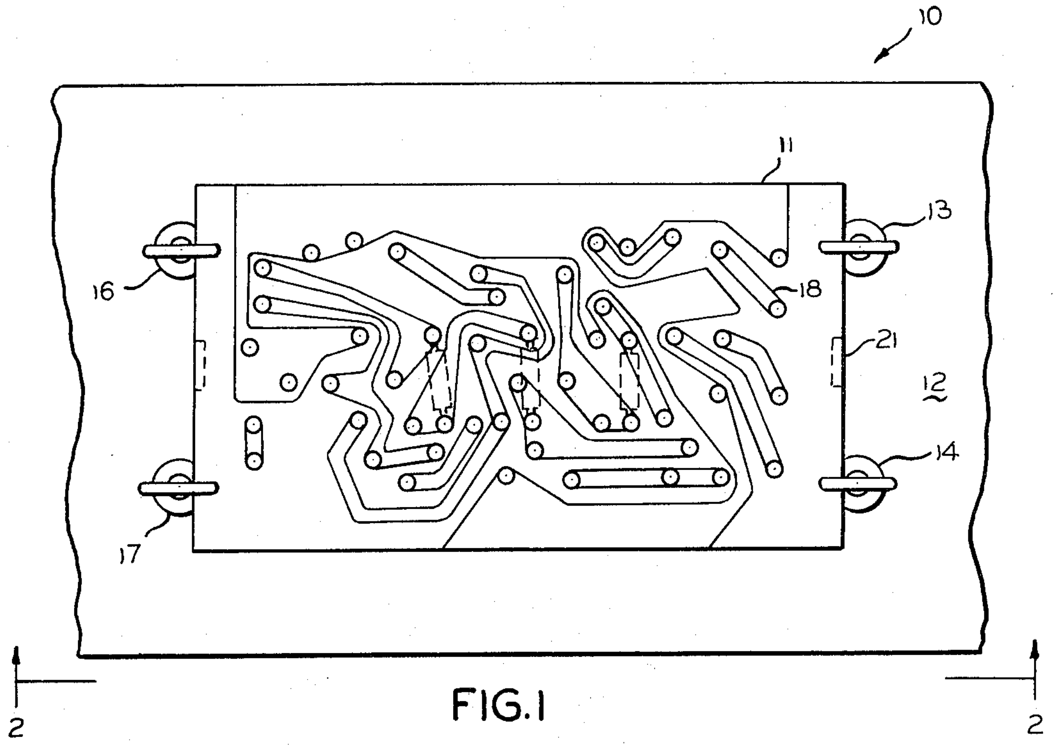
FIG. 1 is a plan view of the nail-less wing headed fasteners used in assembling a printed circuit board to a chassis.
Figure 2:
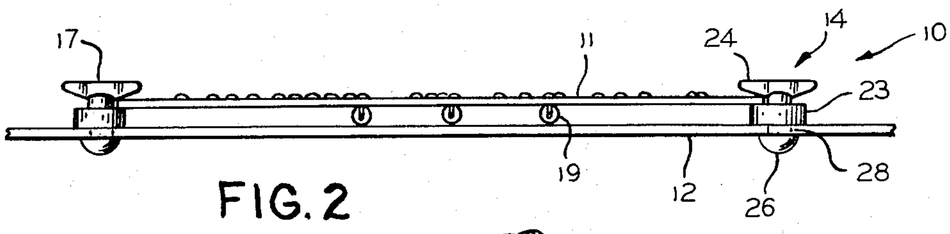
FIG. 2 is a side view of the printed circuit board and chassis assembly of FIG. 1.

The assembly 10 shown in FIGS. 1 and 2 includes a printed circuit board 11 reliably but removably held to chassis 12 using four nail-less wing headed fasteners 13, 14, 16 and 17. The printed circuit board 11 is shown as comprising the printed wiring thereon such as copper section 18 for example, and the wiring is shown interconnecting components such as resistor 19, for example. Connectors, such as connector 21 are shown at each end of the printed circuit board for use in interconnecting different printed circuit boards on the chassis.

While there are four wing headed fasteners shown and while these are positioned two on each side of the printed circuit board, it should be understood that fewer or more such wing headed fasteners can be used and that they may be positioned in various arrangements on the chassis to hold the printed circuit board. The arrangement shown has been found to be extremely satisfactory.

Figures 3, 4, 9:
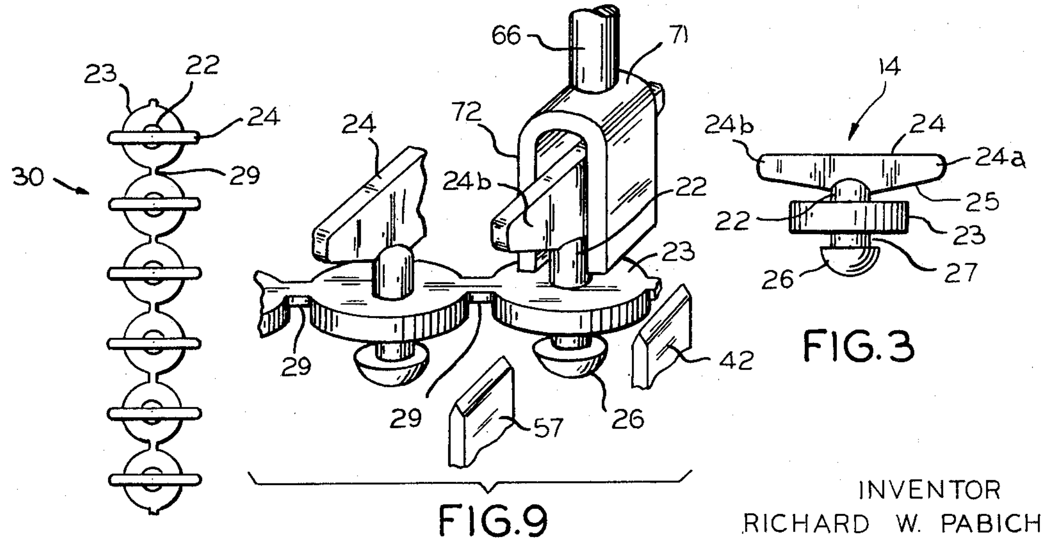

As is best seen in FIGS. 2 and 3, the nail-less wing headed fastener comprises a main body section 22, which is preferably cylindrically shaped. Approximately midway between the top and bottom of the cylindrical main body section is a cylindrical girdle or skirt like appendage 23. The appendage 23 has a larger diameter than the diameter of the main body section 22.

The top of the wing headed fastener comprises wing section 24. The wings either emanate from each side of the central main body section or the entire wing section, as shown in FIG. 3, can be raised from the top of the main body section. The wing section 24 comprises a side 24*a* and an opposite side 24*b*. While each of the sides of the wing section 24 are shown extending beyond the diameter of the main body section, such extension is unimportant; the main thing is that the wing sides 24*a* and 24*b* are spaced apart from appendage 23 to reliably hold or clamp a printed circuit board, such as printed circuit 11 between the wing section 24 and the appendage 23. Note that the bottom of the wing section 24 is shown biased at 25.

Means are provided for maintaining the wing headed section within the chassis. More particularly the bottom of the wing headed fastener terminates in a knob like hemispherical end 26. The knob like hemispherical end has a diameter that is slightly larger than the diameter of the cylindrical main body section. The distance 27 between the appendage 23 and the knob like hemispherical end 26 is sufficient to enable the chassis section to be clamped therebetween and thereby to reliably hold the wing headed section attached to a planar surface, such as on a chassis.

Thus, as best seen in FIG. 2, the knob like hemispherical end 26 is forced through an aperture 28 in chassis 12. The aperture has a slightly smaller diameter than the diameter of the knob like hemispherical end so that it is due to the resiliency of the material from which the wing headed fastener is fabricated that enables the knob like hemispherical end of the fastener to be forced through the aperture 28. The chassis is held tightly between appendage 23 in the space or groove 27.

The printed circuit board 11 is clamped in the space between the wing portion 24 of fastener 14 and the appendage 23. To that end, it has been found beneficial to have the bottom of the wing portion 24 biased at 25 for example from the portion of the bottom of the wing headed fastener that is contiguous to the main body section going toward the outside of the wing section 24. This bias contributes to the ease of turning the wing headed fastener using the wing section 24, and nonetheless, enables a reliable clamping action on the printed circuit board, or the like.

As is best seen in FIG. 3 the nail-less wing headed fasteners in one preferred embodiment are inter-connected in a serial chain like arrangement by means of gates, such as gate 29. This enables a whole series of the wing headed fasteners to be loaded into a magazine used in automatic tools to place the wing headed fasteners in position in apertures on surfaces such as the planar surfaces of a chassis.

The unique applique or attachment for use in fastening the nail-less wing headed fastener, as described herein, to chassis or the like, are preferably used in connection with an automatic drive tool, such as air tools, which are commonly used for automatically driving nails. An exemplary embodiment thereof heretofore have been illustrated and described in U.S. Pat. Nos. 2,755,475; 2,872,901; 3,018,740; 3,081,741; 3,081,742; 3,056,964; and 3,056,965. Such an air tool is shown and referred to as numeral 31 in FIGS. 5 and 6. As illustrated in those drawings, the air tool 31 is provided with an actuation trigger 32 and a handle 33.

At the bottom of the tool, a characterized aperture 34 is defined by a magazine assembly tool attachment 35. The tool attachment is designed to be attached to the commercially available automatic nailers for the purpose of automatically inserting the nail-less wing fastener onto chassis, or the like. The characterized aperture 34 is shaped to allow the wing headed fastener to be forcibly moved from the tool as the fastener is severed from its serial inter-connection with the chain 30, of FIG. 4.

The magazine assembly includes a channel 36 formed in the wing headed fastener magazine 37. The channel 36 includes undercut slots 38 (FIG. 7) for receiving the wings 24*a* and 24*b* of the fasteners to thus slidably receive and capture the strip 30.

The strip 30 of the fasteners are spring biased on one end by spring driven actuator means 41 and are stopped at the other end by a first cut-off means 42 when the front most wing headed fastener abuts the first cut-off means 42. The first cut-off means is sandwiched between a fastener plate 43 and the magazine 37. A second cut-off means 44 is located proximate to the front end of the set of fasteners to enable each of the individual fasteners to be severed after they are positioned for fastening into the apertures in the chassis, or the like.

Figures 5, 6, 7, 8:
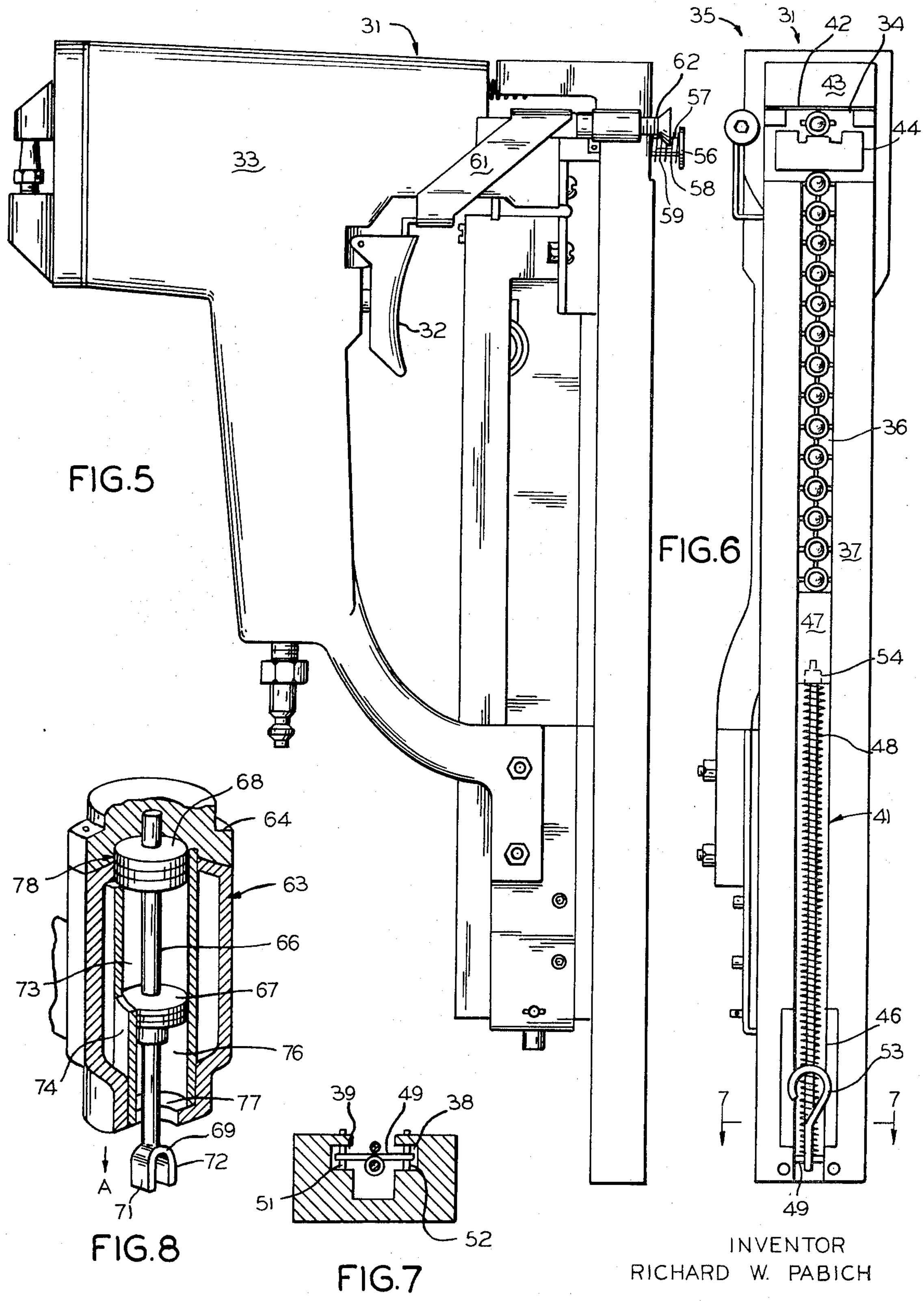

The channel 36 with its undercut slot 38, 39 is shaped in conformity to the cross section of the fasteners as illustrated in FIG. 7. The channel 36 has an opening 46 proximate to the rear end thereof. The opening 46 acts to receive the chain of fasteners 30 in the channel 36.

The spring means 41 has a front member 47 attached to a retainer shaft 48 having a rear peg member 49 extending therefrom. The rear peg member is sized so that it can fit through the opening 46, as well as be slidably received in the slots 38, 39. Thus, the spring means 41 is retained in channel 36 and the force of the spring pushing member 47 pushes against strip 30 and peg 49. Peg 49 abuts retaining means, such as post 51 and 52.

Handle means, such as handle 53, are provided on spring means 41, and is shown as integral to the spring retainer shaft 48. The handle means facilitate proper positioning of the spring means 41 into and out of the opening 46. The spring retaining shaft 48 is journaled through journal 54 on member 47 so that member 47 rides on the shaft to press against strip 30 responsive to the exertion of the spring force. The shaft is shown broken away for convenience; actually, it extends almost the entire length of the magazine 37; that is, the length of the shaft 48 plus the length of member 47 reaches from posts 51 and 52 to the characterized aperture 34. The characterized aperture 34 is directly interconnected with the channel 36.

The first cut-off means 42 is held to fastening plate 43 by means of pins, or the like (not shown). The first cut-off means cooperates with the characterized aperture to locate the fasteners for activation as illustrated in FIG. 9. It will be noted, particularly in FIG. 5, that the second cut-off means 44 has a bottom plate 56, as well as a cutter plate 57 extending upward toward the inter-connecting gate 29 of each of the fasteners positioned in the characterized aperture 34.

The cut-off means 44 is spring biased away from the tool by spring means 58 (see FIG. 5). The spring means 58 is interposed between the magazine 37 and the horizontal plate 56 of the cut-off means 44 at a location to cause the cut-off means 44 to slidingly move upward and downward on a pair of post members, such as post 59, for example extending between the tool and the cut-off means 44.

Safety means are provided for enabling the piston of the air gun and thus preventing any fortuitous expulsion of one of the fasteners. More particularly, safety catch 61 is provided which must be completely depressed for the trigger 32 to be actuated. The safety catch 61 is associated with release lever or piston 62. When the gun is positioned with the characterized aperture 34, aligned with the chassis aperture and with the bottom of the magazine contiguous to top surface of the chassis lever 61 is moved so as to enable trigger 32.

Means are operated responsive to the actuation of the trigger for exerting a force on the wing headed fasteners to force them from the characterized aperture and into the aligned aperture of the chassis, or the like. More particularly, piston means are arranged within the handle 33.

In FIG. 8 there is shown the basic reciprocating piston assembly 63. The piston assembly comprises a cylinder 64 having a piston rod 66 centrally located therein. A disc 67 is located at one side of the piston rod and disc 68 is located at the other side of the piston rod.

Means integral to said piston rod are provided for applying the force directly to said wing head fastener. More particularly, an embodiment utilizes a twin tine U-shaped arrangement 69 integrally attached to the piston rod 66. This arrangement fits over the winged section of the nail-less fastener to abut against the main body of the nail-less fastener for driving it from the characterized aperture. The U-shaped tine section includes tines 71 and 72, which fit around the wing portion of the fastener.

The piston cylinder arrangement of FIG. 8 can be any well known actuator device such as are disclosed in the above listed patents. As shown in FIG. 8, an opening 73 in the inner cylinder walls 74 enables air under pressure to enter the inner cylinder and apply a force against the disc 67. Since the other end of piston rod 66 is flush against the end of the outer cylinder 64 and since there is only normal air pressure in cylinder chamber 76, the piston is forced in the direction of the arrow A. Therefore, tines 71 and 72 abut against the nail-less fastener and drive it into an aligned aperture. When disc 67 abuts against shoulder 77 at the end of the stroke of the piston, disc 67 is aligned with the bottom of aperture 73 so that the pressurized air pushes against a disc (not shown) opposite disc 68 to cause the piston to return to its starting position. Thus, the piston is caused to reciprocate and drive succeeding ones of the winged fasteners into apertures of the chassis. The force of the piston against the winged fastener also caused the cutting edges to shear the gates and release the fasteners as they are being forced through the characterized aperture. Thus, in operation, the unique nail-less wing fastener is automatically driven into apertures in surfaces such as those on chassis, or the like, to removably attach the nail-less fasteners into the chassis and enable the winged fasteners to be positioned to retain printed circuit boards, or the like, to the surfaces to which the fasteners are attached.

While, I have illustrated a preferred embodiment of my invention, the scope thereof is intended to include other embodiments which are suggested by the disclosure. For instance, it is conceivable that other shapes or attachments for associating the wing headed fasteners disclosed herein with driving tools could be employed to achieve the objectives herein disclosed.

Having thus described my invention, what we claim and desire to secure by United States Letters Patent is:

1. A wing headed fastener for use in removably attaching first members to second members,
- said fastener comprising a main body portion,
- said main body portion having a top end and a bottom end,
- at least one wing portion projecting outwardly from said top end,
- the bottom end terminating in knob-like means,
- a skirt-like spacer appendage extending from said main body portion spaced apart from said knob-like means and said winged portion, said appendage having substantial thickness to provide stand off spacing between said members,
- said knob-like means being slightly larger than said main body portion whereby when said knob-like means is forced through an aperture in said second member the said second member is trapped between said skirt-like appendage and said knob-like means to attach said wing headed fastener to said second member, and said skirt-like appendage being spaced apart from said wing portion a distance slightly smaller than the thickness of said first member, whereby said first member can be clampingly held between said wing portion and said skirt-like appendage, and be held a substantial distance away from said second member.

2. The wing headed fastener of claim 1 wherein said body portion is cylindrically shaped.

3. The wing headed fastener of claim 2 wherein said skirt like appendage is cylindrically shaped and wherein the diameter of said cylindrical skirt like appendage is larger than the diameter of said main body portion.

4. The wing headed fastener of claim 3 wherein said knob-like means is hemispherically shaped with the rounded portion at the bottom of said fastener.

5. The wing headed fastener of claim 4 where said at least one wing portion projecting outwardly from said top and comprises a wing having a biased bottom whereby said wing headed fastener when clampingly holding said first member can more easily be turned to release said first member.

6. The wing headed fastener of claim 1 and means for serially attaching a plurality of said wing headed fasteners to form a chain of said wing headed fasteners.

7. The chain of wing headed fasteners of claim 6 wherein said fastening means comprises gate means attaching one skirt like appendage to the skirt like appendage of the following one of the plurality of wing headed fasteners.

* * * * *